(12) United States Patent
Tseng et al.

(10) Patent No.: US 12,035,031 B2
(45) Date of Patent: Jul. 9, 2024

(54) MINIATURIZED CAMERA DEVICE

(71) Applicant: GUANGZHOU LUXVISIONS INNOVATION TECHNOLOGY LIMITED, Guangzhou (CN)

(72) Inventors: Cheng-Te Tseng, New Taipei (TW); Sheng-Chieh Yang, New Taipei (TW)

(73) Assignee: GUANGZHOU LUXVISIONS INNOVATION TECHNOLOGY LIMITED, Guangzhou (CN)

(*) Notice: Subject to any disclaimer, the term of this patent is extended or adjusted under 35 U.S.C. 154(b) by 98 days.

(21) Appl. No.: 17/887,534

(22) Filed: Aug. 15, 2022

(65) Prior Publication Data

US 2023/0319388 A1 Oct. 5, 2023

(30) Foreign Application Priority Data

Mar. 22, 2022 (CN) .......................... 202220631953.8

(51) Int. Cl.
| | |
|---|---|
| *H04N 23/57* | (2023.01) |
| *G02B 7/04* | (2021.01) |
| *H04N 23/51* | (2023.01) |
| *H05K 1/18* | (2006.01) |

(52) U.S. Cl.
CPC .............. *H04N 23/57* (2023.01); *G02B 7/04* (2013.01); *H04N 23/51* (2023.01); *H05K 1/189* (2013.01)

(58) Field of Classification Search
CPC .......... H04N 23/57; H04N 23/51; G02B 7/04; H05K 1/189
See application file for complete search history.

(56) References Cited

U.S. PATENT DOCUMENTS

| | | | |
|---|---|---|---|
| 2013/0136437 A1* | 5/2013 | Asakawa ............... | G02B 27/64 396/55 |
| 2016/0170227 A1* | 6/2016 | Minamisawa ......... | H04N 23/57 359/557 |
| 2016/0231641 A1* | 8/2016 | Minamisawa ..... | H04N 23/6812 |
| 2021/0250475 A1* | 8/2021 | Jeong .................... | H04N 23/57 |

* cited by examiner

*Primary Examiner* — Gevell V Selby

(57) ABSTRACT

A camera device connected to a terminal device, comprising a baseplate, a support frame, a photo shooting component, a flexible flat cable, and a limiting member. The baseplate comprises a first surface, a second surface, and a side surface between the first surface and the second surface. The support frame is disposed on the first surface of the baseplate. The photo shooting component is disposed on the support frame and is electrically connected to the baseplate. The flexible flat cable is disposed on the baseplate, and comprises a first extension section, a second extension section, and a bent section between the first extension section and the second extension section. One end of the first extension section away from the bent section is disposed on the side surface. The bent section is bent around the side surface and extends to the second surface.

7 Claims, 14 Drawing Sheets

MINIATURIZED CAMERA DEVICE

CROSS-REFERENCE TO RELATED APPLICATION

This application claims the priority benefit of Chinese Patent Application Serial Number 202220631953.8, filed on Mar. 22, 2022, the full disclosure of which is incorporated herein by reference.

BACKGROUND

Technical Field

The present disclosure relates to the technical field of camera device, particularly to a camera device having a specific flexible flat cable.

Related Art

With the miniaturization of electronic products, the design and processing of electronic components have been put into a considerable challenge. For example, when the space between components turns narrower, the external shape design and arrangement of components becomes more difficult. In addition, as the space is limited, the interference between components would also become more significant. Taking a camera device installed on a mobile phone as an example, which generally transmits signals to the mobile phone through a flexible flat cable, where one end of the flexible flat cable is connected to the baseplate of the camera device, and another end is electrically connected to the mobile phone in a bent manner. However, in the case that the size of electronic products wish to be reduced, the bending radius of the flexible flat cable is limited due to material properties so it is difficult to be reduced correspondingly. As a result, the flexible flat cable may have obvious interference with other components. Thus, the present disclosure intends to provide an improved camera device to solve the problem that the size of the camera devices in prior arts is difficult to reduce, and to allow the bending shape of the flexible flat cable satisfies the requiring design.

SUMMARY

The embodiments of the present disclosure provide a camera device tended to solve the problem that the size of the camera device in prior arts is difficult to be reduced to allow the bending shape of the flexible cable to satisfy the requiring design.

On the first aspect, the present disclosure provides a camera device connected to a terminal device, the camera device comprising a baseplate, a support frame, a photo shooting component, a flexible flat cable, and a limiting member. The baseplate comprises a first surface, a second surface, and a side surface between the first surface and the second surface. The support frame is disposed on the first surface of the baseplate. The photo shooting component is disposed at the support frame and is electrically connected to the baseplate. The flexible flat cable is disposed on the baseplate. The flexible flat cable comprises a first extension section, a second extension section, and a bent section between the first extension section and the second extension section. One end of the first extension section away from the bent section is disposed on the side surface. The bent section is bent around the side surface and extends to the second surface. One end of the second extension section away from the bent section is electrically connected to the terminal device. The limiting member is disposed on the support frame or the baseplate and abuts against the bent section to limit a bending radius of the bent section.

In some embodiments, the limiting member protrudes from one side of the support frame close to the bent section and extends along a direction parallel to the first surface. The limiting member abuts against an outer surface of the bent section.

In some embodiments, the flexible flat cable comprises a limiting perforation. The support frame comprises a limiting column. The limiting column protrudes from one side of the support frame close to the bent section and extends in a direction perpendicular to the first surface. The limiting column and the limiting perforation are mutually engaged.

In some embodiments, the limiting member comprises a bent part and a flat part. The flat part is disposed on the second surface of the baseplate. The bent part is disposed at one side of the flat part. The bent part is attached to an inner surface of the bent section of the flexible flat cable.

In some embodiments, the limiting member comprises a bent part and a flat part. The flat part is disposed on the side surface of the support frame. The bent part is disposed at one side of the flat part. The bent part is attached to an outer surface of the bent section of the flexible flat cable.

In some embodiments, the limiting member further comprises an extension part disposed at one side of the plane part. The extension part extends along the second surface of the baseplate.

In some embodiments, the limiting member further comprises two hollow openings respectively disposed between two sides of the bent part and the flat part.

In some embodiments, the flexible flat cable further comprises a limiting hollow part. The limiting member comprises a T-shaped bump and a flat part. The flat part is disposed on the second surface of the baseplate. The T-shaped bump is disposed at one side of the flat part. The T-shaped bump protrudes from the limiting hollow part and abuts against an outer surface of the bent section of the flexible flat cable.

On a second aspect, the present disclosure provides a camera device electrically connected to a terminal device, the camera device comprising a baseplate, a support frame, a photo shooting component, and a flexible flat cable. The baseplate comprises a first surface, a second surface, and a side surface between the first surface and the second surface. The second surface comprises a plurality of first connecting units. The support frame is disposed on the first surface of the baseplate. The photo shooting component is disposed on the support frame and is electrically connected to the baseplate. The flexible flat cable is disposed on the second surface of the baseplate. One end of the flexible flat cable comprises a plurality of second connecting units electrically connected to the plurality of first connection units. Another end of the flexible flat cable is electrically connected to the terminal device.

On a third aspect, the present disclosure provides a camera device electrically connected to a terminal device, the camera device comprising a baseplate, a support frame, a photo shooting component, a first flexible flat cable, and a second flexible flat cable. The baseplate comprises a first surface, a second surface, and a side surface between the first surface and the second surface. The second surface comprises a plurality of first connecting units. The support frame is disposed on the first surface of the baseplate. The photo shooting component is disposed on the support frame and is electrically connected to the baseplate. The first flexible flat cable is disposed on the side surface of the baseplate. The first flexible flat cable extends in a direction parallel to the side surface. The first flexible flat cable comprises a plurality of first connecting units. The second flexible flat cable is disposed on the first flexible flat cable. The second flexible flat cable comprises a first extension section and a second extension section. The first extension section partially overlaps with the first flexible flat cable. The first extension section comprises a plurality of second connecting units electrically connected to the plurality of first connecting units. The second extension section extends in a direction parallel to the second surface. One end of the second extension section is connected to the first extension section. Another end of the second extension section is electrically connected to the terminal device.

In the embodiments of the present disclosure, the bending radius of the flexible flat cable can be limited by changing the configuration of the flexible flat cable and by additional limiting members. In this way, the interference between the flexible flat cable and other components could be greatly eliminated in the camera device of the present disclosure, thereby the size of the camera device could be effectively reduced.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
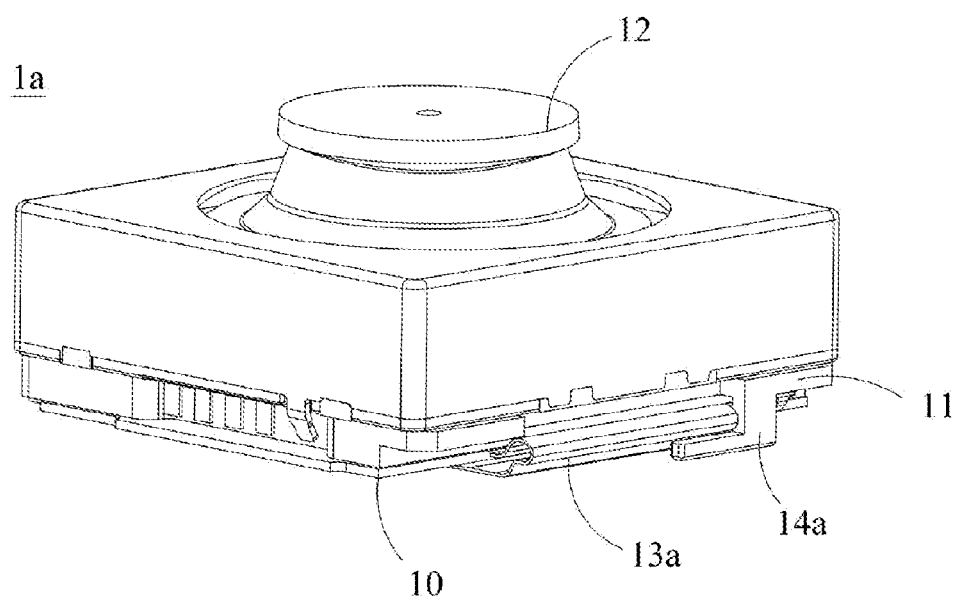
FIG. 1 is a perspective view of a camera device of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the present disclosure, a camera device is electrically connected to a terminal device. For example, the terminal device could be smart phone, smart watch, smart tablet, smart TV, laptop computer, or any electronic product linked with the camera device, but is not limited thereto. Refer to FIG. 1 to FIG. 4, which are respectively a perspective view, an exploded view, another perspective view, and yet another perspective view of the camera device of the first embodiment of the present disclosure. As shown in the figures, a camera device 1a comprises a baseplate 10, a support frame 11, a photo shooting component 12, a flexible flat cable 13a, and a limiting member 14a, where the purposes and details of each of the components above would be described below.

The baseplate 10 carries the support frame 11, the camera assembly 12, and other components mentioned below. In some embodiments, the baseplate 10 could be a part of the terminal device but is not limited thereto. For example, the baseplate 10 could be an outer casing or an inner casing of the terminal device so that other components of the camera device 1a are disposed on or in the terminal device. In other embodiments, the baseplate 10 can also be an independent element and is fixed to the terminal device by means known to those skilled in the art, such as adhering, locking, welding, etc.

In some embodiments, the baseplate 10 may comprise a circuit configuration that is electrically connected to the photo shooting component 12. For example, the baseplate 10 may have a semiconductor configuration such as a complementary metal-oxide-semiconductor (CMOS) formed thereon through a semiconductor process for light sensing, to convert external light entering the image sensor component through the photo shooting component 12 into electronic signals. It should be noted that the above-exemplified elements, configurations, or types thereof are only examples, the present application would not be limited thereto. In other embodiments, the baseplate 10 may also include a plurality of baseplate sub-layers, one of which can be a glass plate, silicon plate, plastic plate, or baseplate known to those skilled in the art for carrying other elements. Another one of the plurality of baseplate sub-layers can be a circuit board provided with a semiconductor configuration for signal conversion such as light sensing. That is, in these embodiments, the baseplate 10 comprises a base material for carrying elements and a circuit board for light sensing/transmitting signals.

The baseplate 10 comprises a first surface 100, a second surface 101, and a side surface 102 between the first surface 100 and the second surface 101. In some embodiments, when the baseplate 10 is single-layered, the first surface 100 refers to an upper surface of the baseplate 10, and the second surface 101 refers to a lower surface of the baseplate 10. In some embodiments, when the baseplate 10 comprises a plurality of baseplate sub-layers, the first surface 100 is an outer surface of a baseplate sub-layer (or a surface far from other baseplate sub-layers) closest to the support frame 11 among the plurality of sub-layers, the second surface 101 is an outer surface of the baseplate sub-layer (or a surface far from other baseplate sub-layers) farthest from the support frame 11 among the plurality of sub-layers. Besides, the side surface 102 is jointly formed by respective side surfaces of the plurality of baseplate sub-layers.

Figure 2:
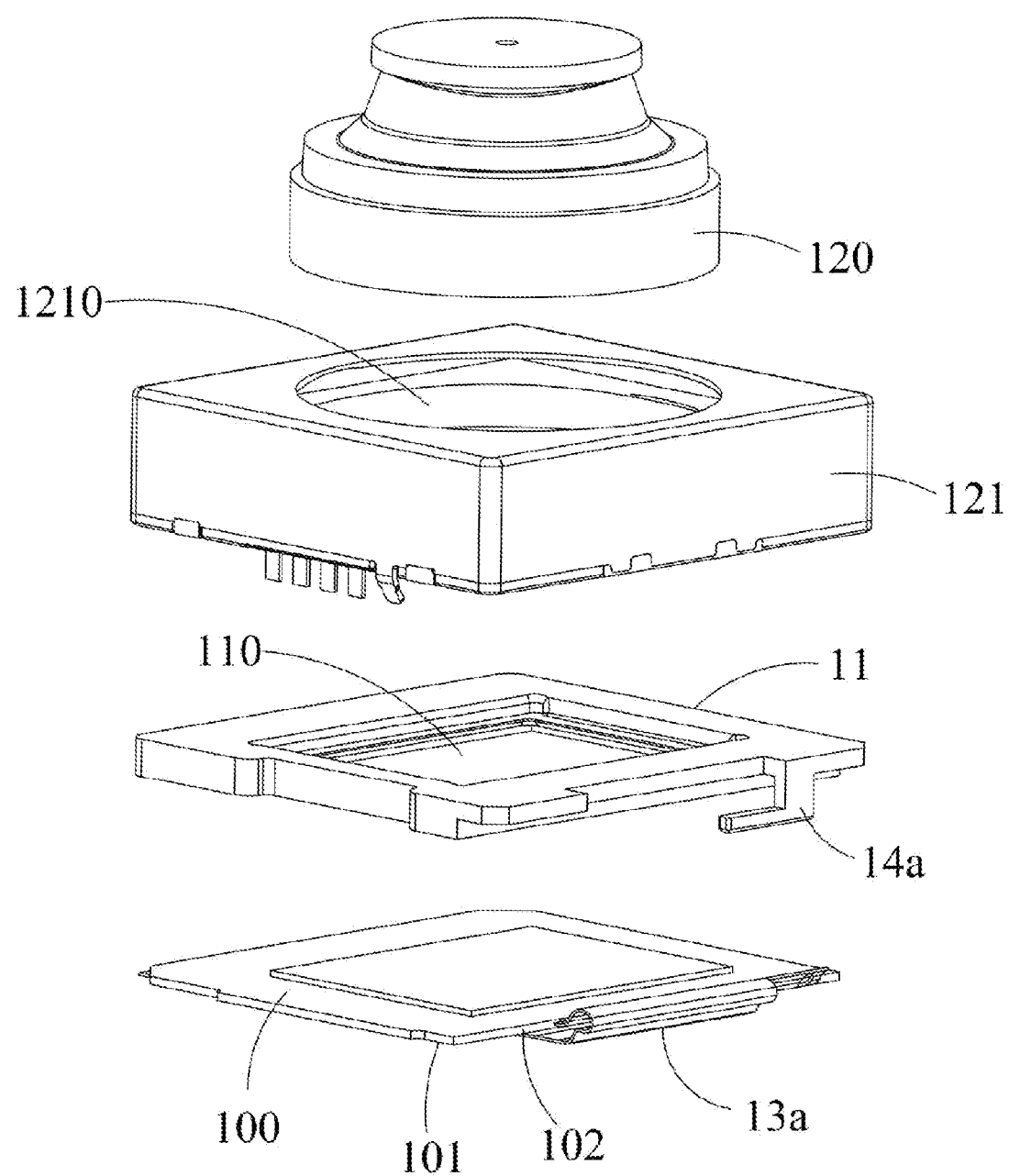
FIG. 2 is an exploded view of a camera device of the first embodiment of the present disclosure.

The support frame 11 is disposed on the first surface 100 of the baseplate 10. In this embodiment, the support frame 11 is disposed around the periphery of the first surface 100 of the baseplate 10 and forms an accommodating space 110 (see FIG. 2) at the center thereof. The accommodating space 110 at the center of the support frame 11 is through the upper surface and the lower surface of the support frame 11, allowing the photo shooting component 12 above the support frame 11 (one side away from the baseplate 10) to be electrically connected to the baseplate 10 below the support frame 11 (one side close to the baseplate 10), directly or indirectly. It should be noted that the shape and appearance of the support frame 11 shown in FIG. 2 are only examples, the present disclosure is not limited thereto.

The photo shooting component 12 is disposed at the support frame 11 and is electrically connected to the baseplate 10. In some embodiments, the photo shooting component 12 could comprise a lens 120 and a casing 121, where the casing 121 comprises an opening 1210 from which the lens 120 is exposed. It should be noted that the photo shooting component 12 of the present disclosure is not limited to the above elements. In other embodiments, the photo shooting component 12 may further comprise a filter for improving image quality, a rotating mechanism for multi-axial image stabilization, a coil and a magnet for focusing, and other elements known to those skilled in the art.

Figure 3:
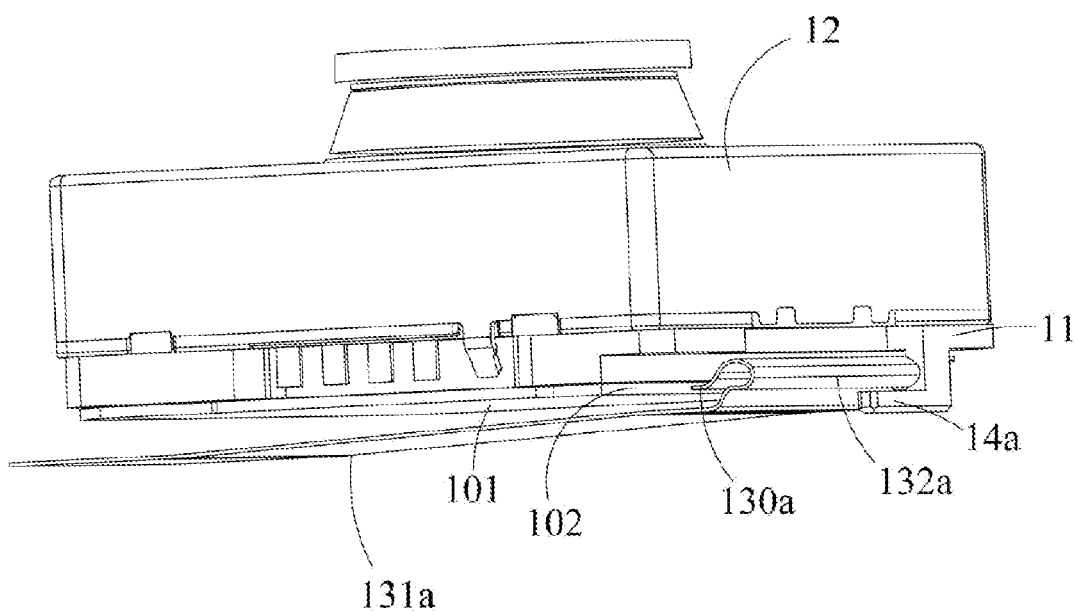
FIG. 3 is another perspective view of a camera device of the first embodiment of the present disclosure.
Figure 4:
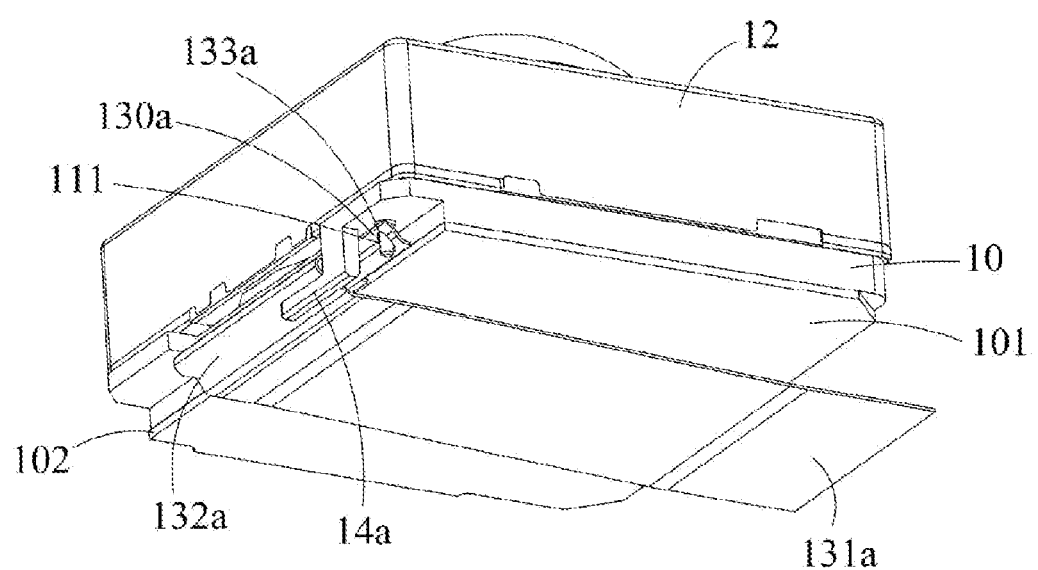
FIG. 4 is yet another perspective view of a camera device of the first embodiment of the present disclosure.

As shown in FIG. 3 and FIG. 4, one end of a first extension section 130a away from a bent section 132a is disposed on the side surface 102. The bent section 132a is bent around the side surface 102 and extends to the second surface 101, and one end of a second extension section 131a away from the bent section 132a is electrically connected to the terminal device. More specifically, the flexible flat cable 13a is used for the electrical connection for the baseplate 10 and the terminal device, so that the image information captured by the photo shooting component 12 could be transmitted to the terminal device through the baseplate 10.

In some embodiments, when the baseplate 10 comprises a plurality of baseplate sub-layers, the first extension section 130a of the flexible flat cable 13a would protrude from two adjacent layers of the plurality of baseplate sub-layers. Moreover, the flexible flat cable 13a could also comprise a fixed section. The fixed section is disposed in two adjacent layers of the plurality of baseplate sub-layers and is connected to the first extension section 130a, where the fixed section electrically connect to a circuit board in the baseplate 10 that generates a signal, directly or indirectly. Compared with the first extension section 130a, the second extension section 131a, and the bent section 132a, the fixed section could be a section fixed to the baseplate 10 and does not displace relative to elements such as the baseplate 10 or the photo shooting component 12 in accordance with the multi-axial compensation of the camera device. In contrast, compared with the first extension section 130a, the second extension section 131a, and the bent section 132a, the fixed section could be a section that displaces relative to the baseplate 10 or the photo shooting component 12. That is, the first extension section 130a, the second extension section 131a, and the bent section 132a could be movable sections.

In some embodiments, the flexible flat cable 13a may comprise an insulative layer and a conductive layer. For example, the material of the insulative layer could be polyimide or other suitable materials, and the material of the conductive layer can be metal, conductive plastic and etc. By wrapping the insulative layer on two sides of the conductive layer, unintended electric current paths between the conductive layer and other components can be avoided. It should be noted that, when the insulative layer is a polyimide film, the flexible flat cable 13a would have a certain degree of flexibility/bendability. However, limited by the bonding direction of material, the flexible flat cable 13a is still difficult to be bent considerably (for example, to the bending radius which is extremely small), even at right angles.

Since the flexible flat cable 13a may comprise the material mentioned above that is flexible but cannot be bent at a right angle (i.e. the bending radius of the flexible flat cable 13a is relatively large when the flexible flat cable 13a is reversely bent by 180 degrees), the camera device 1a of this embodiment could be further provided with a limiting member 14a to allow the bending radius of the flexible flat cable 13a to be smaller, where the limiting member 14a can be disposed at the support frame 11 or the baseplate 10 (at the support frame 11 in this embodiment), and can be in contact with the bent section 132a of the flexible flat cable 13a to limit the bending radius of the bent section 132a. In this way, the actual volume occupied by the bent section 132a would not be oversized. Preferably, the restricted bent section 132a does not extend beyond the second surface 101 of the baseplate 10 in vertical direction. In the following, the possible concepts and configurations of the limiting member 14a would be explained through different embodiments, allowing the technical features of the present disclosure to be comprehensible and clear.

As shown in FIG. 3 or FIG. 4, in some embodiments, the limiting member 14a protrudes from one side of the support frame 11 close to the bent section 132a and extends along a direction parallel to the first surface 100, and abuts against an outer surface of the bent section 132a. The bent section 132a can be divided into several regions by the limiting member 14a extending from the support frame 11. As shown in FIG. 3, when being abutted by the limiting member 14a, the bent section 132a can be divided into a "C-shaped region" and a "stepped region", where the "C-shaped region" refers to a part that is not interfered by the limiting member 14a, and the "stepped region" refers to an region that becomes stepped when being abutted by the limiting member 14a. When the bent section 132a is divided into several regions, the space surrounded by an inner side of the bent section 132a would be obviously downsized. Thus, the actual volume occupied by the bent section 132a is also significantly smaller, thereby improving space utilization and reducing the possibility of interference with other components.

As shown in FIG. 4, in some embodiments, the flexible flat cable 13a comprises a limiting perforation 133a. In this embodiment, the limiting perforation 133a of the flexible flat cable 13a is disposed at the first extension section 130a, but the present disclosure is not limited thereto. In other embodiments, the limiting perforation 133a of the flexible flat cable 13a can also be provided at the bent section 132a, which can be adjusted according to actual requirements. Besides, the support frame 11 further comprises a limiting column 111. The limiting column 111 protrudes from one side of the support frame 11 close to the bent section 132a and extends along a direction perpendicular to the first surface 100. The limiting column 111 and the limiting perforation 133a are mutually engaged. By providing the limiting perforation 133a and the limiting column 111 that are corresponding disposed, the displacement of the flexible flat cable 13a in horizontal direction (i.e., parallel to the first surface 100) can be effectively limited.

Figure 5:
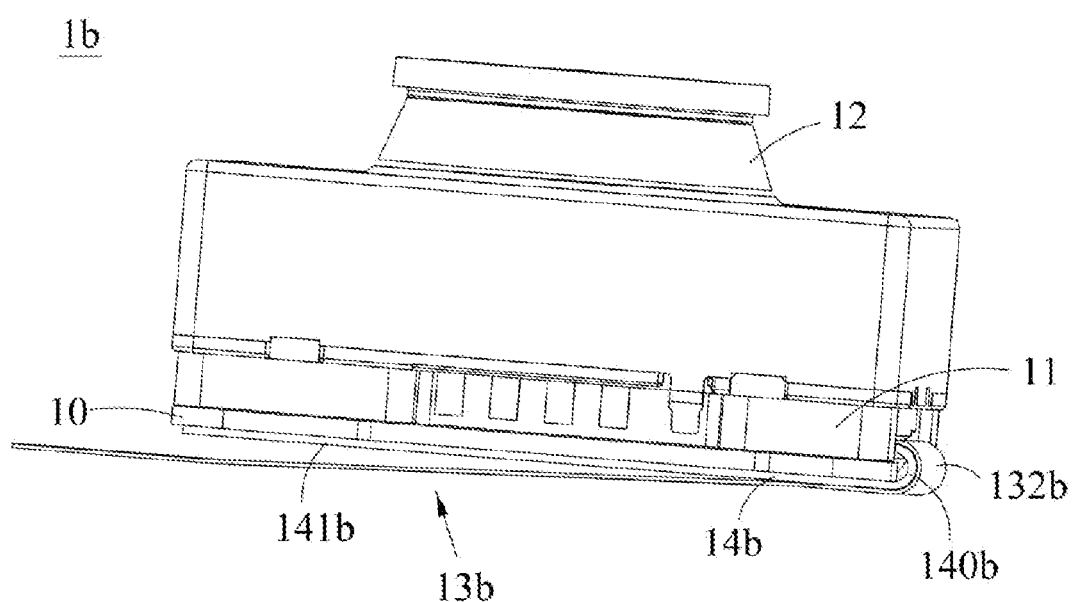
FIG. 5 is a perspective view of a camera device of the second embodiment of the present disclosure.
Figure 6:
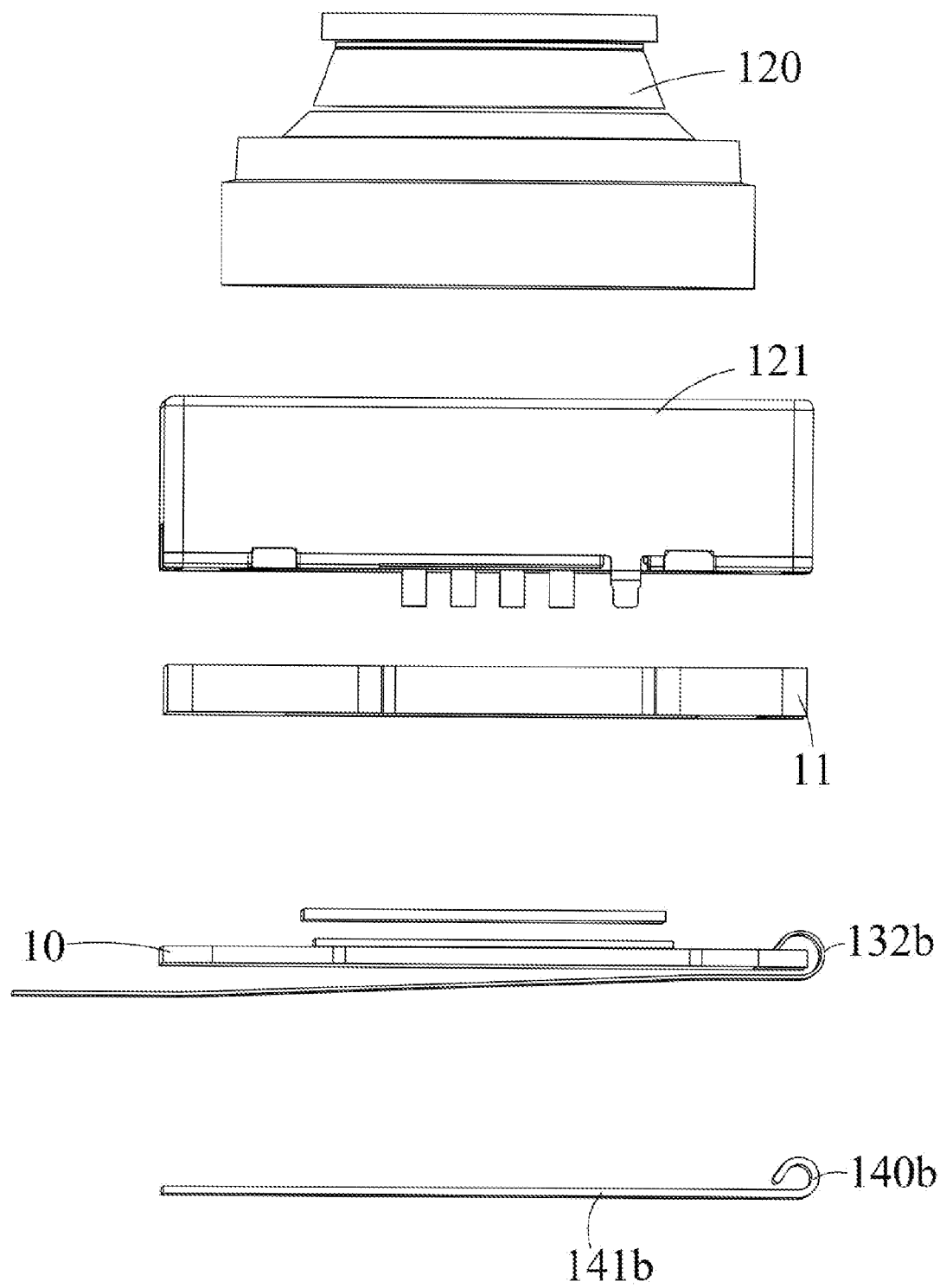
FIG. 6 is an exploded view of a camera device of the second embodiment of the present disclosure.

Refer to FIG. 5 and FIG. 6, which are perspective view and exploded view of the camera device of the second embodiment of the present disclosure. The difference between this embodiment and the first embodiment is that the limiting member 14b of this embodiment is different from that of the first embodiment. For description, the same or similar element symbols would not be repeated herein. In a camera device 1b of the this embodiment, a limiting member 14b is an individual plate-shaped element, which comprises a bent part 140b and a flat part 141b. The flat part 141b is disposed on a second surface 101 of a baseplate 10, the bent part 140b is disposed at one side of the flat part 141b, and the bent part 140b is attached to an inner surface of a bent section 132b of a flexible flat cable 13b. In other words, the limiting member 14b of this embodiment is disposed between the flexible flat cable 13b and the baseplate 10. Besides, the limiting member 14b is a hard element and has a predetermined bending radius. In this way, the flexible flat cable 13b can be attached to the limiting member 14b so the bending radius of the flexible flat cable 13b can be pretty much close to the predetermined bending radius, where the bent part 140b of the limiting member 14b can be adjusted to a predetermined bending radius according to design requirements. In some embodiments, the flexible flat cable 13b could be fixed to the limiting member 14b by adhering or a manner having similar effects, but the present disclosure is not limited thereto.

Figure 7:
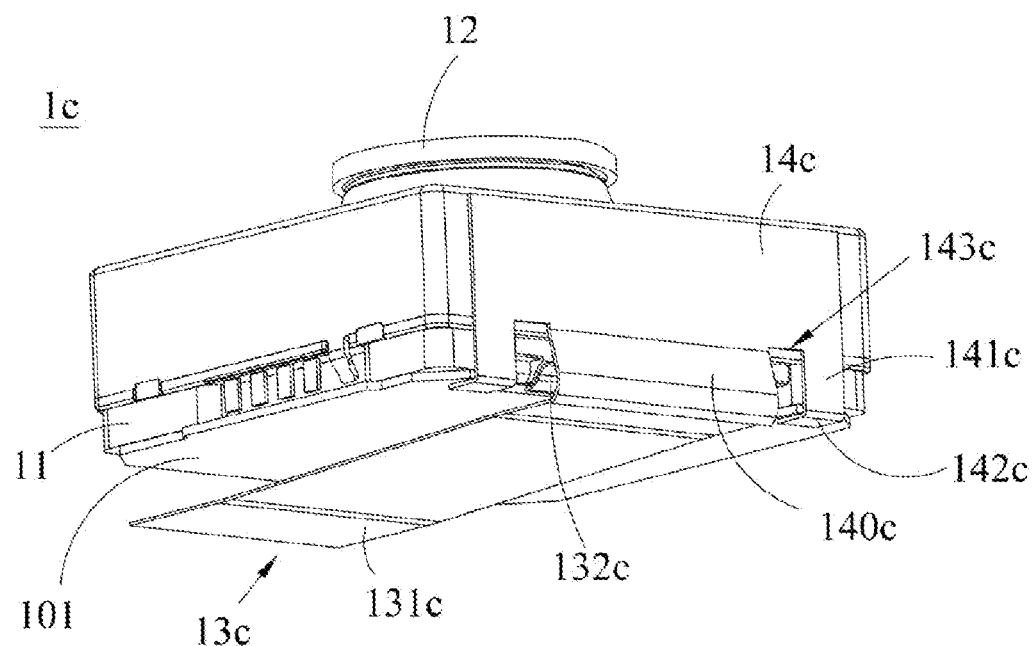
FIG. 7 is a perspective view of a camera device of the third embodiment of the present disclosure.
Figure 8:
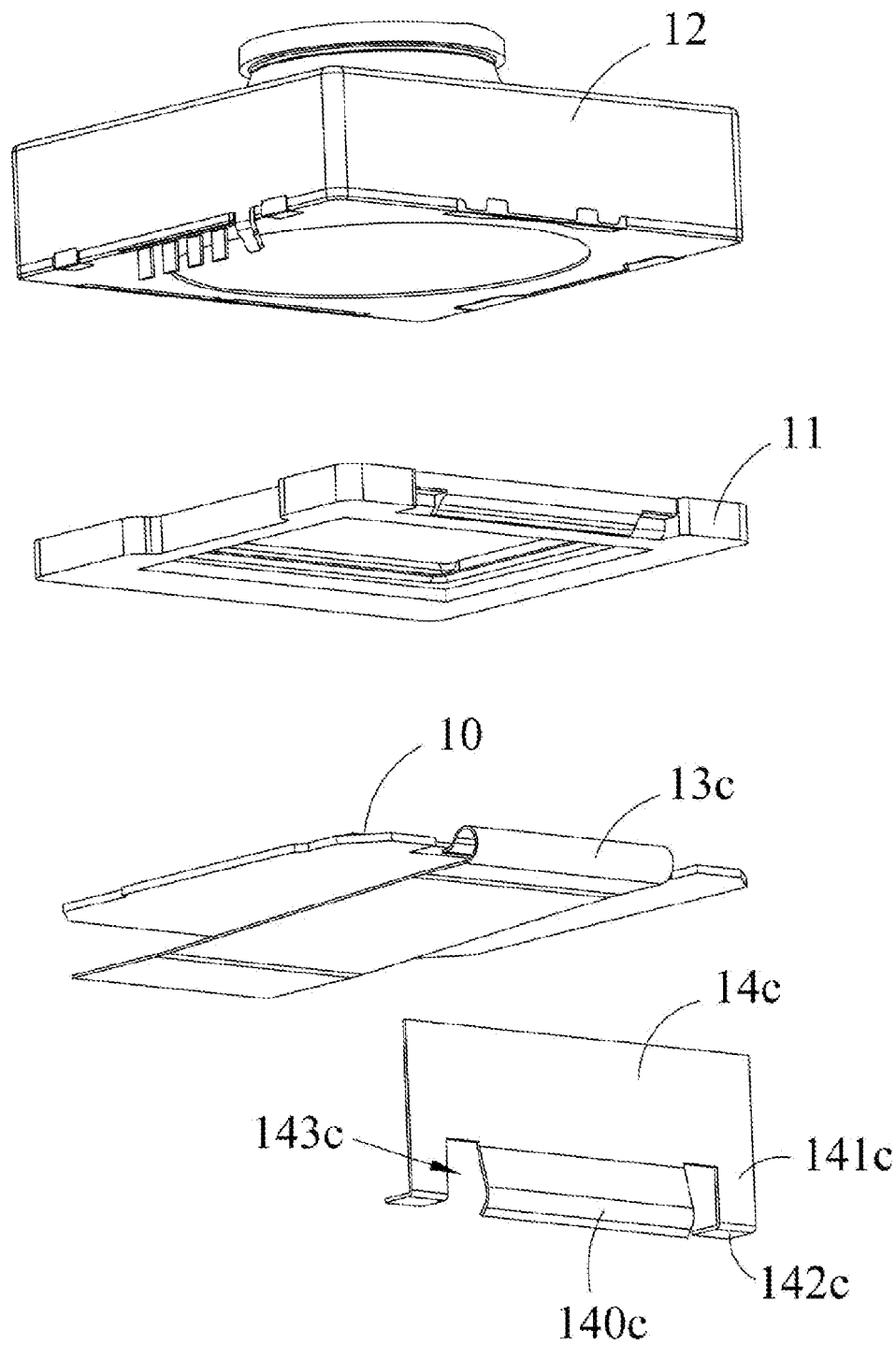
FIG. 8 is an exploded view of a camera device of the third embodiment of the present disclosure.

FIG. 7 and FIG. 8 are perspective view and exploded view of a camera device of the third embodiment of the present disclosure. The difference between this embodiment and the first embodiment is that the limiting member 14c of this embodiment is different from that of the first embodiment. For description, the same or similar element symbols would not be repeated herein. In a camera device 1c of this embodiment, a limiting member 14c comprises a bent part 140c and a flat part 141c, the flat part 141c is disposed on a side surface 102 of a support frame 11, the bent part 140c is disposed at one side of the flat part 141c, and the bent part 140c is attached to an outer surface of a bent section 132c of a flexible flat cable 13c. In other words, the limiting member 14c of this embodiment is disposed at the outer side of the flexible flat cable 13c and limits the bending radius of the flexible flat cable 13c by abutment. Besides, the limiting member 14c is a hard element and has a predetermined bending radius. In this way, the flexible flat cable 13c can be attached to the limiting member 14c so the bending radius of the flexible flat cable 13c can be pretty much close to the predetermined bending radius, where the bent part 140c of the limiting member 14c can be adjusted to a predetermined bending radius according to design requirements. In some embodiments, the flexible flat cable 13c could be fixed to the limiting member 14c by adhering or a manner having similar effects, but the present disclosure is not limited thereto.

In some embodiments, the limiting member 14c further comprises an extension part 142c. The extension part 142c is disposed at one side of the flat part 141c and extends along a second surface 101 of a baseplate 10. Through the extension part 142c extending along the second surface 101, the limiting member 14c can be stably fixed to a camera device 1a. In some embodiments, the extension part 142c could be fixed to the second surface 101 by means known to those skilled in the art, such as engaging, adhering, locking, etc., but the present disclosure is not limited thereto. For example, the extension part 142c and the second surface 101 of the baseplate 10 may be respectively provided with corresponding locking holes, which can be mutually engaged using screws, etc.

In some embodiments, the limiting member 14c further comprises two hollow openings 143c respectively disposed between two sides of the bent part 140c and the flat part 141c. With the hollow openings 143c, the bent part 140c can be separated from the flat part 141c by a specific distance. For example, when the flexible flat cable 13c is slightly displaced/offset, a potential friction causing damage between the bent part 140c and the flat part 141c can be effectively prevented as a side edge of the flexible flat cable 13c is separated from the flat part 141c by the hollow openings 143c.

Figure 9:
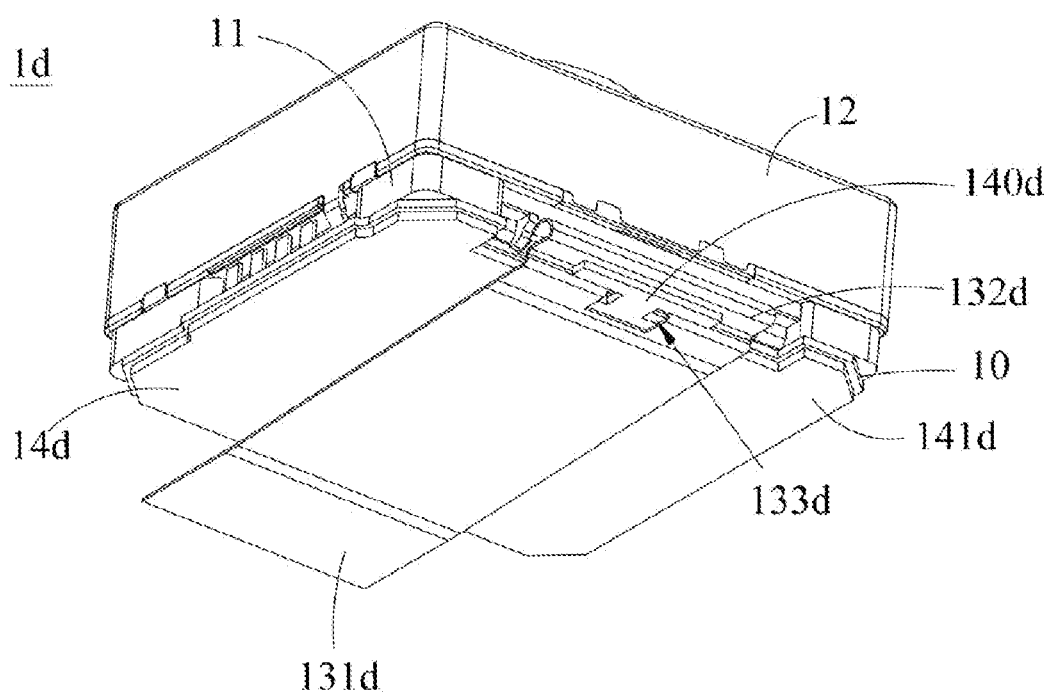
FIG. 9 is a perspective view of a camera device of the fourth embodiment of the present disclosure.
Figure 10:
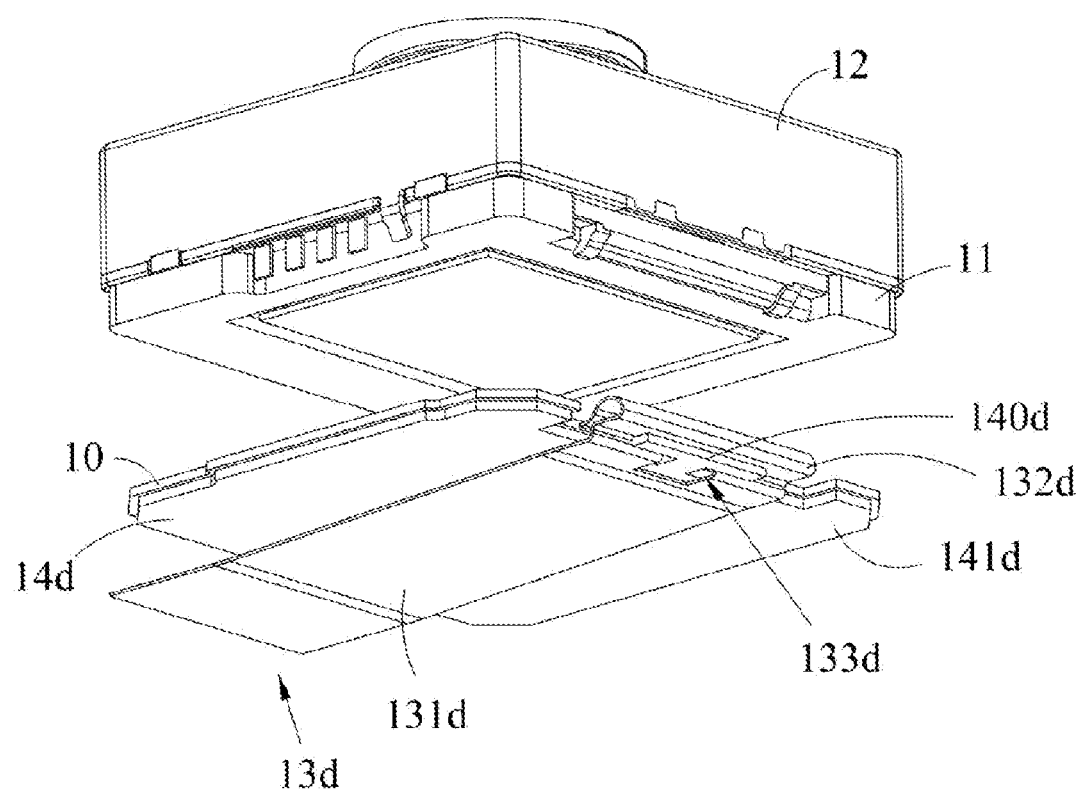
FIG. 10 is an exploded view of a camera device of the fourth embodiment of the present disclosure.

FIG. 9 and FIG. 10 are perspective view and exploded view of a camera device of the fourth embodiment of the present disclosure. The difference between this embodiment and the first embodiment is that the limiting member 14d of this embodiment is different from that of the first embodiment. For description, the same or similar element symbols would not be repeated herein. In a camera device 1d of this embodiment, a flexible flat cable 13d comprises a limiting hollow part 133d. Specifically, the limiting hollow part 133d can be disposed at the bent section 132d or the second extension section 131d of the flexible flat cable 13d. On the other hand, a limiting member 14d is a plate-shaped element and is disposed on a second surface 101 of a baseplate 10 (i.e., below the baseplate 10). The limiting member 14d comprises a T-shaped bump 140d and a flat part 141d, the flat part 141d is disposed on the second surface 101 of the baseplate 10, the T-shaped bump 140d is disposed at one side of the flat part 141d, and the T-shaped bump 140d protrudes from the limiting hollow part 133d and abuts against an outer surface of a bent section 132d of the flexible flat cable 13d. Similar to the first embodiment, the T-shaped bump 140d of this embodiment could divide the bent section 132d into several regions. As shown in FIG. 10, when interfered with the limiting member 14d, the bent section 132d can be divided into a "C-shaped region" and a "stepped region", where the "C-shaped region" refers to a part that is not interfered by the limiting member 14d, and the "stepped region" refers to an region that becomes stepped when being abutted by the limiting member 14d. When the bent section 132d s divided into several regions, the space surrounded by an inner side of the bent section 132d would be obviously downsized. Thus, the actual volume occupied by the bent section 132d is also significantly smaller, thereby improving space utilization and reducing the possibility of interference with other components.

Figure 11:
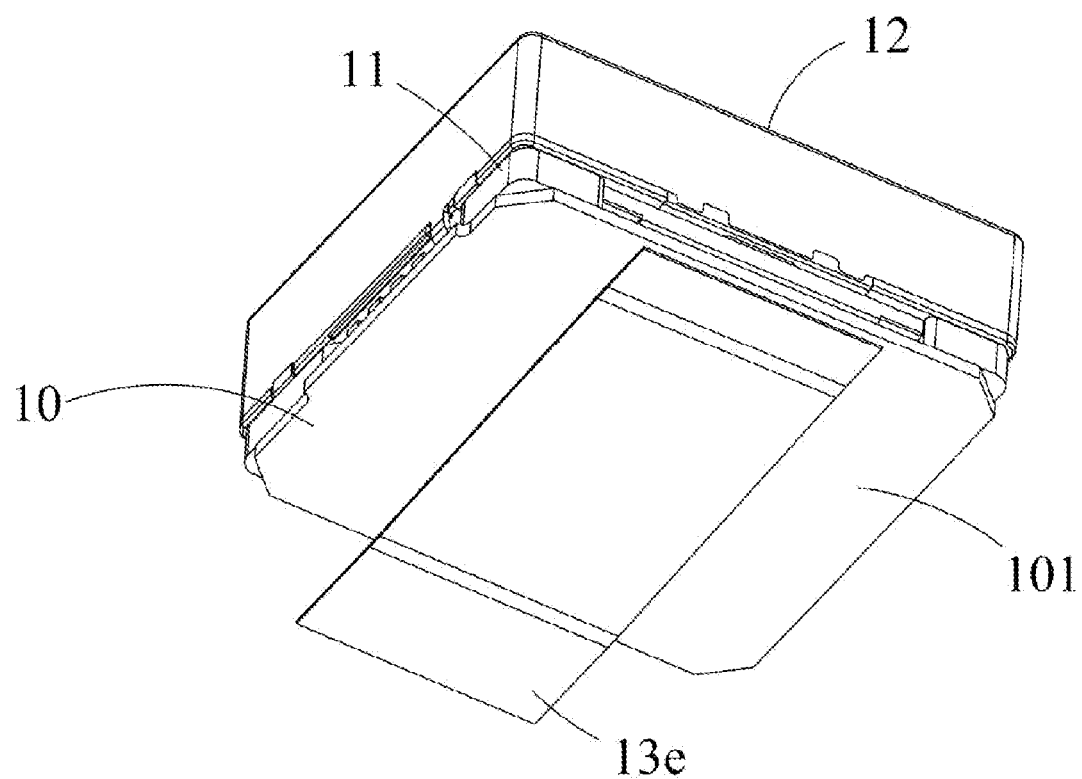
FIG. 11 is a perspective view of a camera device of the fifth embodiment of the present disclosure.
Figure 12:
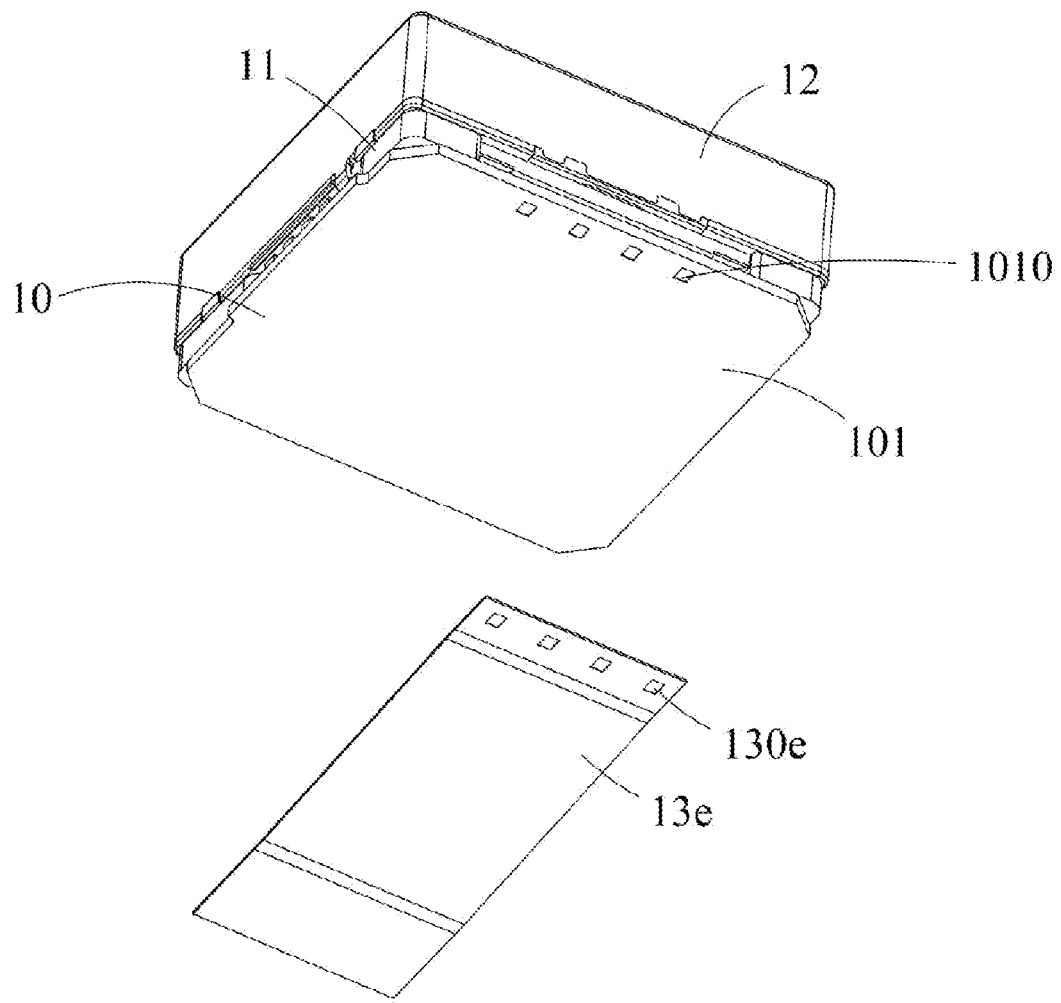
FIG. 12 is an exploded view of a camera device of the fifth embodiment of the present disclosure.

FIG. 11 and FIG. 12 are perspective view and exploded view of a camera device of the fifth embodiment of the present disclosure. The difference between this embodiment and the first embodiment is that no limiting member is provided in this embodiment. Specifically, this embodiment solves the problems of the prior art by providing a specific configured flexible flat cable 13e different from other embodiments. For description, the same or similar element symbols would not be repeated herein. In a camera device 1e of this embodiment, a second surface 101 of a baseplate 10 comprises a plurality of first connecting units 1010. The flexible flat cable 13e is disposed on the second surface 101 of the baseplate 10, one end of the flexible flat cable 13e comprises a plurality of second connecting units 130e, and the plurality of second connecting units 130e are electrically connected to the plurality of first connecting units 1010. The other end of the flexible flat cable 13e is electrically connected to a terminal device. Wherein, the first connection unit 1010 and the second connection unit 130e may be pads, conductive glue or electrical connecting elements known to those skilled in the art. In other words, in this embodiment, the flexible cable 13e does not require to be bent from the side surface 102 of the baseplate 10 toward the second surface 101 of the baseplate 10 by disposing an electrical connecting region of the baseplate 10 on the second surface 101. In this way, the flexible flat cable 13e of this embodiment would not have a bent section, so the oversized problem of the bent section can be eliminated.

Figure 13:
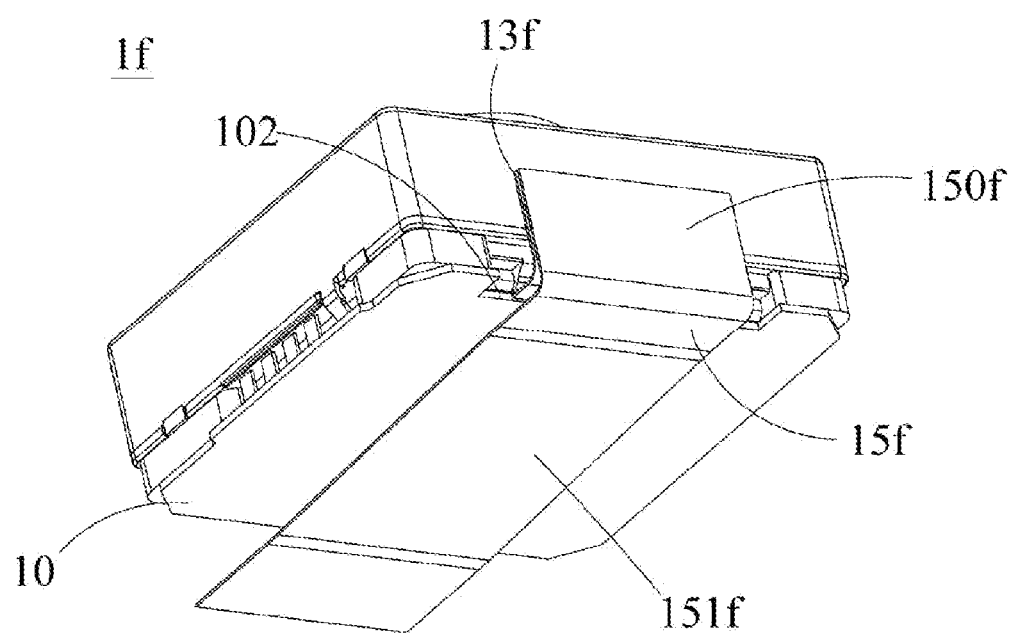
FIG. 13 is a perspective view of a camera device of the sixth embodiment of the present disclosure.
Figure 14:
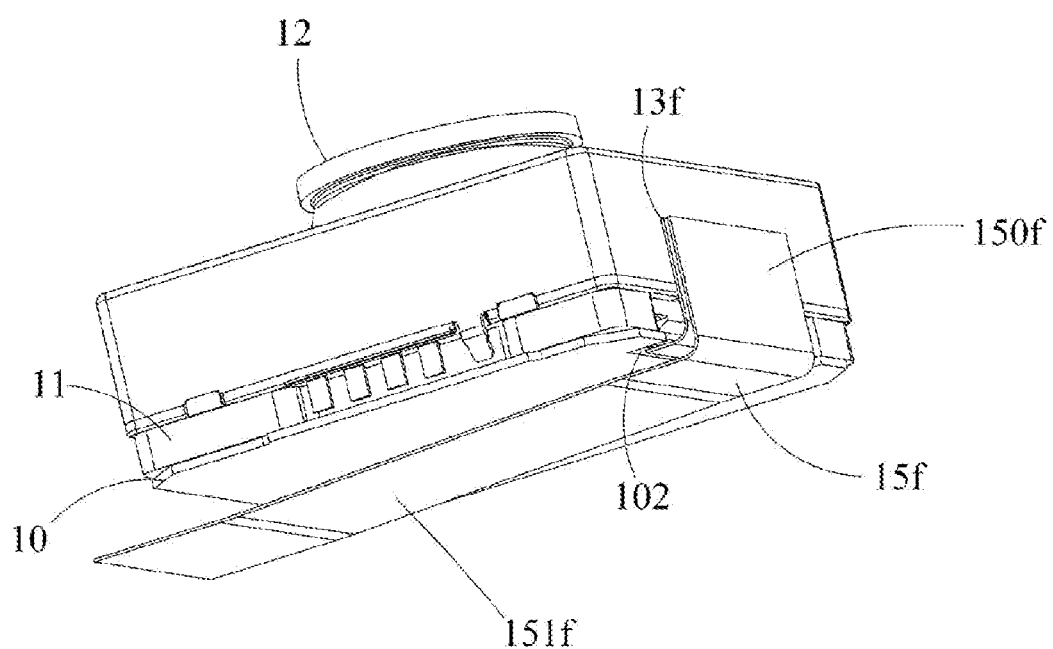
FIG. 14 is another perspective view of a camera device of the sixth embodiment of the present disclosure.

FIG. 13 and FIG. 14 are perspective views of a camera device of the sixth embodiment of the present disclosure. The difference between this embodiment and the first embodiment is that no limiting member 14a is provided in this embodiment. Specifically, this embodiment solves the problem of the prior art by providing two flexible flat cables. Besides, for description, the same or similar element symbols would not be repeated herein. In a camera device 1f of this embodiment, a first flexible flat cable 13f is disposed on a side surface 102 of a baseplate 10, the first flexible flat cable 13f extends in a direction parallel to the side surface 102, and the first flexible flat cable 13f comprises a plurality of first connecting units. A second flexible flat cable 15f is disposed on the first flexible flat cable 13f and comprises a first extension section 150f and a second extension section 151f. The first extension section 150f partially overlaps with the first flexible flat cable 13f, the first extension section 150f comprises a plurality of second connecting units that are electrically connected to the plurality of first connecting units. The second extension section 151f extends in a direction parallel to the second surface 101, one end of the second extension section 151f is connected to the first extension section 150f, and the other end is electrically connected to a terminal device. Compared with previous embodiments, in this embodiment, the single flexible flat cable that needs to be greatly bent is replaced by a connection configuration of the first flexible flat cable 13f and the second flexible flat cable 15f. More specifically, by connecting the first flexible flat cable 13f and the second flexible flat cable 15f which are both bent once, the flexible flat cable is no longer necessary to be bent by a significant angle of 180 degrees.

In summary, in the embodiments of the present disclosure, the bending radius of the flexible flat cable can be limited by changing the configuration of the flexible flat cable and by additional limiting members. In this way, the interference between the flexible flat cable and other components could be greatly eliminated in the camera device of the present disclosure, thereby the size of the camera device could be effectively reduced.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A camera device electrically connected to a terminal device, the camera device comprising:
   a baseplate comprising a first surface, a second surface, and a side surface between the first surface and the second surface;
   a support frame disposed on the first surface of the baseplate;
   a photo shooting component disposed on the support frame and being electrically connected to the baseplate;
   a flexible flat cable disposed on the baseplate, the flexible flat cable comprising a first extension section, a second extension section, and a bent section between the first extension section and the second extension section, one end of the first extension section away from the bent section being disposed on the side surface, the bent section being bent around the side surface and extending to the second surface, one end of the second extension section away from the bent section being electrically connected to the terminal device; and
   a limiting member being disposed on the support frame or the baseplate and abutting against the bent section to limit a bending radius of the bent section;
   wherein the limiting member comprises a bent part and a flat part; the flat part is disposed on the second surface of the baseplate; the bent part is disposed at one side of the flat part; the bent part is attached to an inner surface of the bent section of the flexible flat cable.

2. The camera device according to claim 1, wherein the limiting member protrudes from one side of the support frame close to the bent section, and extends along a direction parallel to the first surface; the limiting member abuts against an outer surface of the bent section.

3. The camera device according to claim 1, wherein the flexible flat cable comprises a limiting perforation; the support frame comprises a limiting column; the limiting column protrudes from one side of the support frame close to the bent section, and extends along a direction perpendicular to the first surface; the limiting column and the limiting perforation are mutually engaged.

4. The camera device according to claim 1, wherein the limiting member comprises a bent part and a flat part; the flat part is disposed on the side surface of the support frame; the bent part is disposed at one side of the flat part; the bent part is attached to an outer surface of the bent section of the flexible flat cable.

5. The camera device according to claim 4, wherein the limiting member further comprises an extension part disposed at one side of the plane part; the extension part extends along the second surface of the baseplate.

6. The camera device according to claim 5, wherein the limiting member further comprises two hollow openings respectively disposed between two sides of the bent part and the flat part.

7. The camera device according to claim 1, wherein the flexible flat cable further comprises a limiting hollow part; the limiting member comprises a T-shaped bump and a flat part; the flat part is disposed on the second surface of the baseplate; the T-shaped bump is disposed at one side of the flat part; the T-shaped bump protrudes from the limiting hollow part and abuts against an outer surface of the bent section of the flexible flat cable.

* * * * *